United States Patent
Tsien et al.

(10) Patent No.: US 7,596,775 B2
(45) Date of Patent: Sep. 29, 2009

(54) METHOD FOR DETERMINING A STANDARD CELL FOR IC DESIGN

(75) Inventors: Dar-Sun Tsien, Los Altos, CA (US); Chien-Kuo Wang, Hsin-Chu (TW); Chen-Hsien Hsu, Hsinchu County (TW); Wei-Jen Wang, Tainan County (TW)

(73) Assignee: United Microelectronics Corp., Hsin-Chu (TW)

( * ) Notice: Subject to any disclaimer, the term of this patent is extended or adjusted under 35 U.S.C. 154(b) by 231 days.

(21) Appl. No.: 11/752,259

(22) Filed: May 22, 2007

(65) Prior Publication Data

US 2008/0295057 A1 Nov. 27, 2008

(51) Int. Cl.
*G06F 17/50* (2006.01)
*H03K 19/00* (2006.01)

(52) U.S. Cl. .............................. 716/17; 716/6; 703/14; 703/19

(58) Field of Classification Search ............... 716/4–6, 716/8, 17; 703/13–22
See application file for complete search history.

(56) References Cited

U.S. PATENT DOCUMENTS

| | | | |
|---|---|---|---|
| 6,169,968 B1 * | 1/2001 | Kabuo | 703/14 |
| 6,523,156 B2 * | 2/2003 | Cirit | 716/9 |
| 6,643,616 B1 | 11/2003 | Granik | |
| 6,754,877 B1 * | 6/2004 | Srinivasan | 716/2 |
| 7,039,569 B1 | 5/2006 | Haws | |
| 2006/0107239 A1 * | 5/2006 | Zhang et al. | 716/1 |
| 2006/0248486 A1 * | 11/2006 | Barnes | 716/6 |
| 2008/0163151 A1 * | 7/2008 | Motiani et al. | 716/17 |

* cited by examiner

*Primary Examiner*—Thuan Do
*Assistant Examiner*—Nha T Nguyen
(74) *Attorney, Agent, or Firm*—Winston Hsu

(57) ABSTRACT

IC design flow includes RTL design, synthesis, APR, and layout. An IC designer can choose a suitable standard cell for an integrated circuit according to the timing, area, and BCI (best cell index) of each standard cell. Further, the BCI of a standard cell can be generated by generating critical dimensions of a standard cell in a plurality of surroundings, generating a plurality of circuit parameters corresponding to the plurality of surroundings, calculating the differences of the plurality of circuit parameters and the ideal circuit parameter of the standard cell, and analyzing the distribution of the differences.

13 Claims, 7 Drawing Sheets

METHOD FOR DETERMINING A STANDARD CELL FOR IC DESIGN

BACKGROUND OF THE INVENTION

1. Field of the Invention

The present invention relates to a method for an integrated circuit, and more particularly, to a method for determining a standard cell for an integrated circuit in the IC design flow.

2. Description of the Prior Art

Integrated circuits (IC) are often implemented by connecting together different types of functional blocks to achieve the desired IC specification. Please refer to FIG. 1. FIG. 1 is a block diagram of IC 10. The IC 10 includes logic blocks 12, memory 14, Input/Output (I/O) 16, analog/mixed signal blocks 18, and custom blocks 20. Some examples of analog/mixed signal blocks include functions of Phase Locked Loops (PLL) and Digital-Analog Converters (DAC). Of these, I/O 16, memory 14 and analog/mixed signal blocks 18 are typically used as a single pre-formed unit, or hard macro, by the IC designer, whereas some of the other blocks, primarily the logic, are constructed from a set of lower level sub-blocks, or standard cells, to enable a higher degree of customization and optimization.

An IC designer typically has numerous options to implement each of the functional blocks to create the best possible design for the IC. With respect to the I/O, memory and/or analog functions, hard macros that implement the required function but which are optimized for higher speed or lower power or smaller area are available, and the IC designer chooses the hard macro best suited to the particular design.

Implementing logic functions is much more complex due to the typically large number of standard cells, ranging from tens of thousands to tens of millions, needed to implement the logic functions. Each standard cell is comprised of a predetermined number of transistors coupled together to perform a particular logic function. For example, there are standard cells that perform the functions of NAND, AND, NOR and OR gates, as well as more complicated logic functions such as single bit adders. The IC designer typically has access to different implementations of these low level functions, the different implementations targeted respectively for lower power, higher speed or smaller area. Electronics design automation (EDA) tools are necessary to analyze various implementations and obtain an optimum result when designing complex logic functions.

Please refer to FIG. 2. FIG. 2 is a flowchart of IC design according to the prior art. Steps of the IC design are as follows.

Step 110: design RTL (register transfer level), the IC designer programs register transfer level code to describe a logic function requirement of the circuit so as to generate a RTL file;

Step 120: synthesis, using synthesis software to verify the RTL file generated in the step 110; the synthesis software is coupled to a library of standard cells; a typical known standard cell library includes a plurality of different cell types, such as AND, NOR, flip-flop and inverter cells, and each cell will be available in several different sizes; the synthesis software analyzes the logic function of the RTL file with an implementation of that function using various types of standard cells that meet the specification;

Step 130: APR (auto place and route), the EDA tool can place and route standard cells for the RTL file that has passed the verification of the synthesis software in the step 120; after APR, a netlist is generated including a list of cells required and the necessary connections between them; in addition, the IC designer can choose a suitable standard cell for the IC according to the area constraint and timing constraint;

Step 140: layout, the placement tool uses the information from the library to place the cells so as to minimize the interconnections required by the netlist; a router then draws the wiring between the placed cells to implement the connectivity specified in the netlist so as to complete the layout.

In general, each cell will be available in several different sizes, the size referring to the size of the output driver transistors. Although the selection of the correctly sized cell is driven by the design, it is unavoidable that a larger cell (larger output driver transistors) will have a greater delay than a smaller cell.

One optimization target for IC design is cost. A smaller area logic circuit will allow a larger number of usable ICs per silicon wafer, reducing the cost of each IC. The IC designer's goal is to design the IC so that the specifications are met using the smallest possible silicon area. The IC designer is typically provided with multiple variants of each hard macro, the variants showing different trade-offs among the variables of area, speed and power. This extends to standard cells where each logic function, for example an AND gate, has multiple different implementations, the different implementations required for different output drive strength. Standard cells with increased drive strength are typically larger than those with relatively less output drive strength. IC design according to the prior art focus on the cost, so the IC design flow mainly assists IC designers to create the smallest implementation of an IC incorporating the various logic function blocks. However, when the IC designer requires designing a circuit of a higher performance and stability, they do not have any reference information.

SUMMARY OF THE INVENTION

The present invention provides a method for determining a standard cell for an integrated circuit comprising providing a plurality of standard cells with a same function; generating critical dimensions of each standard cell in a plurality of surroundings; generating a plurality of circuit parameters corresponding to the plurality of surroundings according to the critical dimensions of each standard cell in the plurality of surroundings; subtracting an ideal circuit parameter of each standard cell from each circuit parameter of the standard cell and so as to generate a plurality of differences of circuit parameters; calculating a distribution of the plurality of differences of circuit parameters of each standard cell so as to generate a best cell index of each standard cell; and choosing one standard cell from the plurality of standard cells with the same function for the integrated circuit according to best cell indices of the plurality of standard cells.

The present invention further provides a method for determining a standard cell for an integrated circuit comprising providing a plurality of standard cells with a same function; generating a first index according to a layout size of each standard cell; generating a second index according to timing data of each standard cell; generating a third index according to critical dimensions of each standard cell in a plurality of surroundings; determining weight and priority of the first, second and third indexes respectively; and choosing one standard cell from the plurality of standard cells with the same function for the integrated circuit according to the weight or priority of the first, second and third indexes of each standard cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
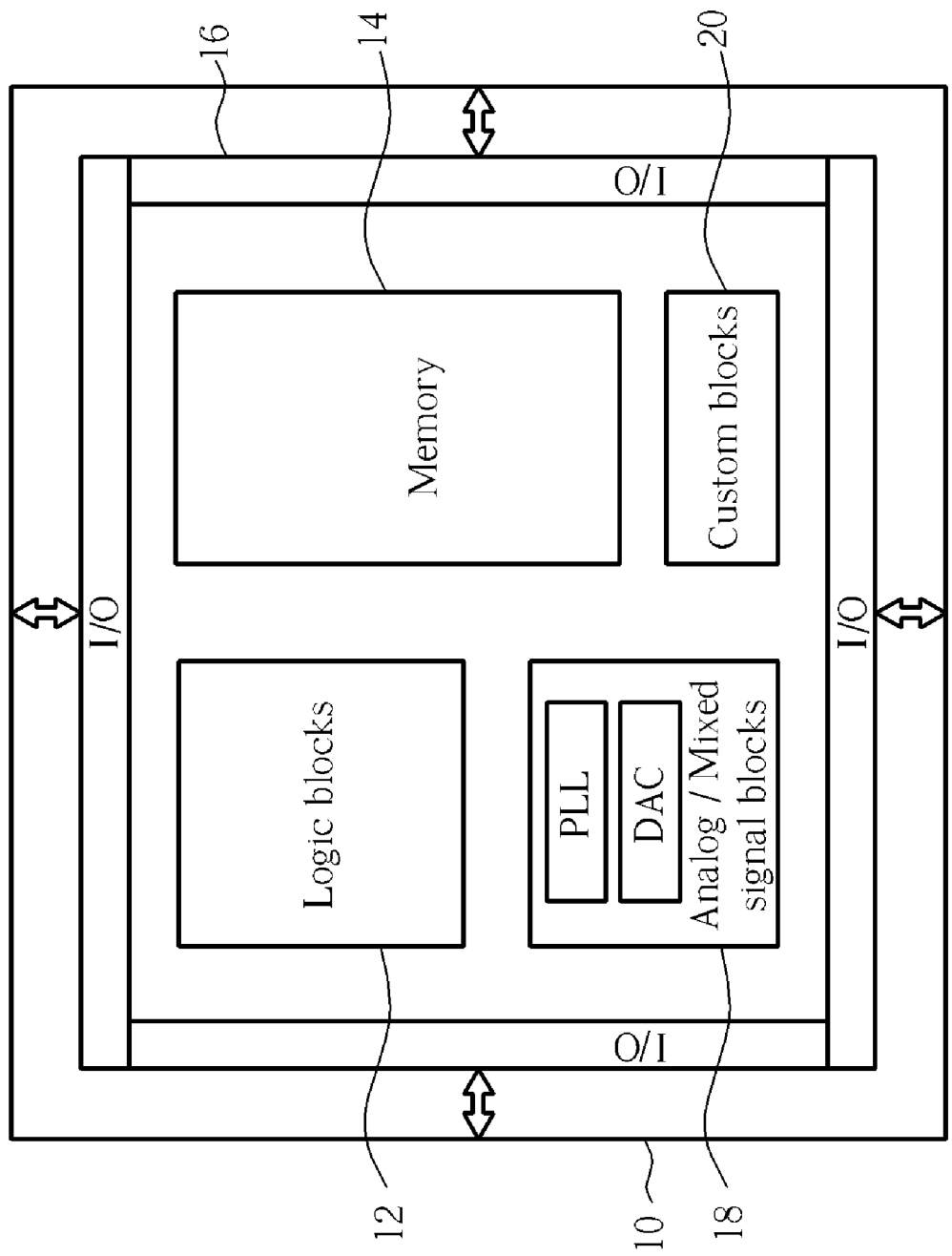
FIG. 1 is a block diagram of IC.
Figure 2:
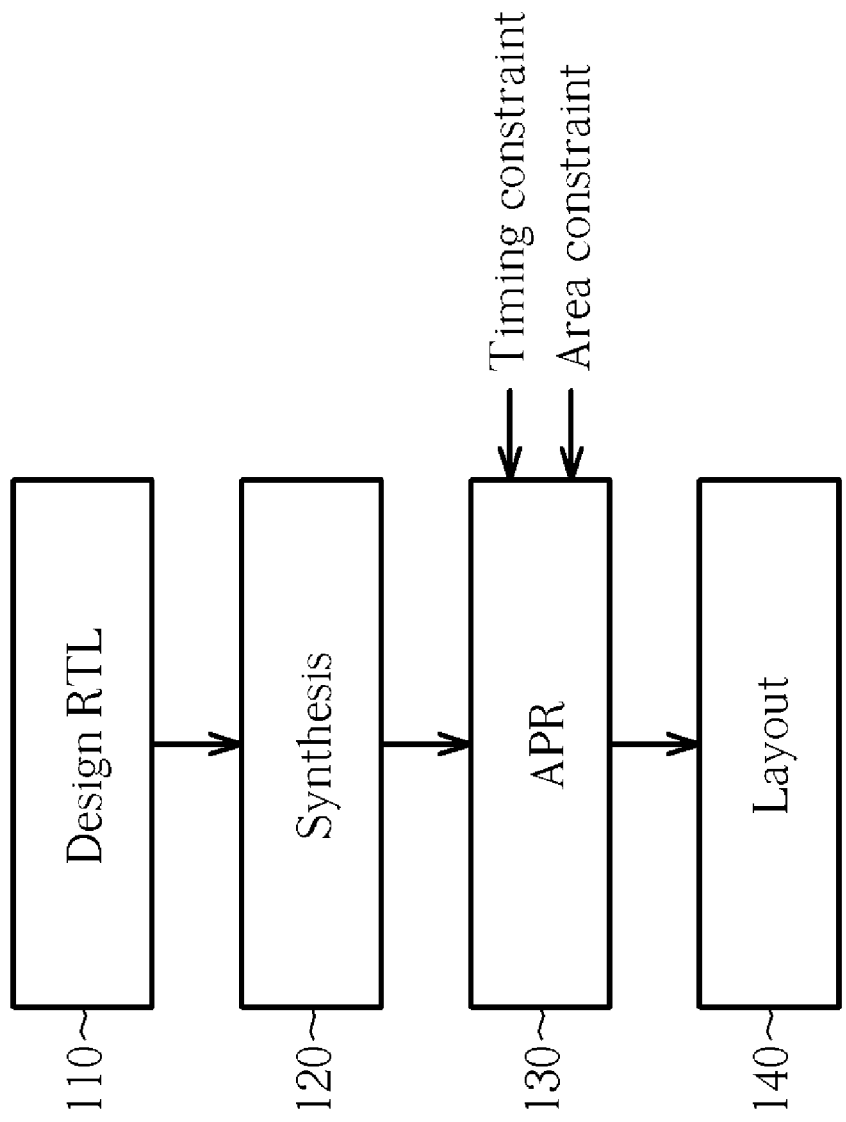
FIG. 2 is a flowchart of IC design according to the prior art.
Figure 3:
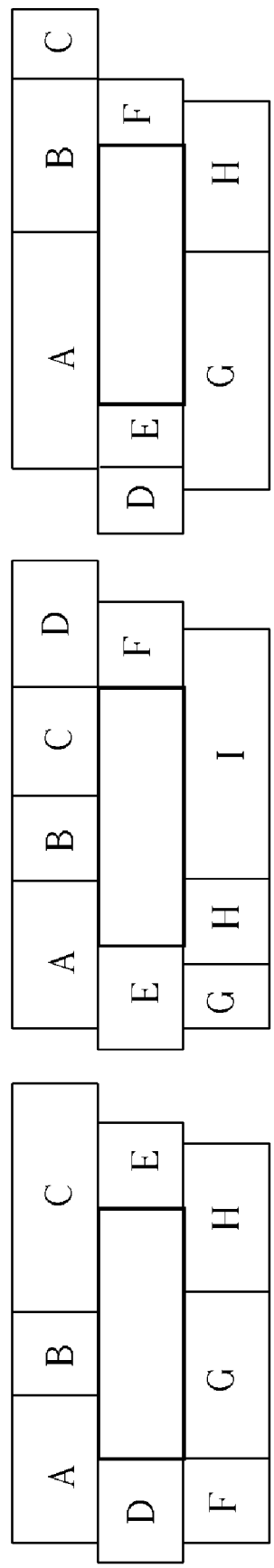
FIG. 3 is a diagram of a standard cell in three different surroundings.

Please refer to FIG. 3. FIG. 3 is a diagram of a standard cell in three different surroundings. Integrated circuits (IC) are often implemented by connecting together different types of functional blocks to achieve the desired IC specification. One optimization target for IC design is cost. A smaller area logic circuit will allow a larger number of usable ICs per silicon wafer, reducing the cost of each IC. An IC designer's goal is to design the IC so that the specifications are met using the smallest possible silicon area. The IC designer typically has numerous options to implement each of the functional blocks to create the best possible design for the IC. In addition, the IC designer can utilize some fundamental standard cells to implement the different functions for the IC with low power consumption, high speed, and small area. Electronics design automation (EDA) tools are necessary to analyze various implementations and obtain an optimum result when designing complex logic functions. The IC designer can choose a suitable standard cell for the IC according to the area constraint and timing constraint. As shown in FIG. 3, the standard cell AN4M6N (blank block) is surrounded in three different conditions. The blocks A to H in condition 1 are LDFQRM2N, BUFM10N, DFQRM0N, CKINVM8N, ADHM0N, LAGCEM3N, FIL4N, and OA122M4N respectively. The blocks A to I in condition 2 are SDFEZRM0N, HDFM4N, BEMXM2N, ND2M4N, HDFQRM2N, HADFM0N, OR4M0N, BUFM14N, and HSDFCRSM1N respectively. The blocks A to H in condition 3 are AOI32M2N, HSDFQM2N, XOR3M1N, CKAN2M6N, ADHM4N, INVM14N, HADFM2N, and LALM16N respectively. When the standard cell AN4M6N is surrounded in the different conditions, the performance of the standard cell AN4M6N may change. For example, when the intervals in the layout of the standard cell are identical, the delay timing of the stand standard cell is not easy influenced by the surroundings and the standard cell can have a stable performance. However, the layout is large for the identical intervals. The small layout sacrifices a part of intervals so that the delay timing of the stand standard cell will be influenced by the surroundings easily and results in a bad performance. Thus, the present invention utilizes simulators to generate an index according to the critical dimensions of the standard cell for the IC designer reference.

Figure 4:
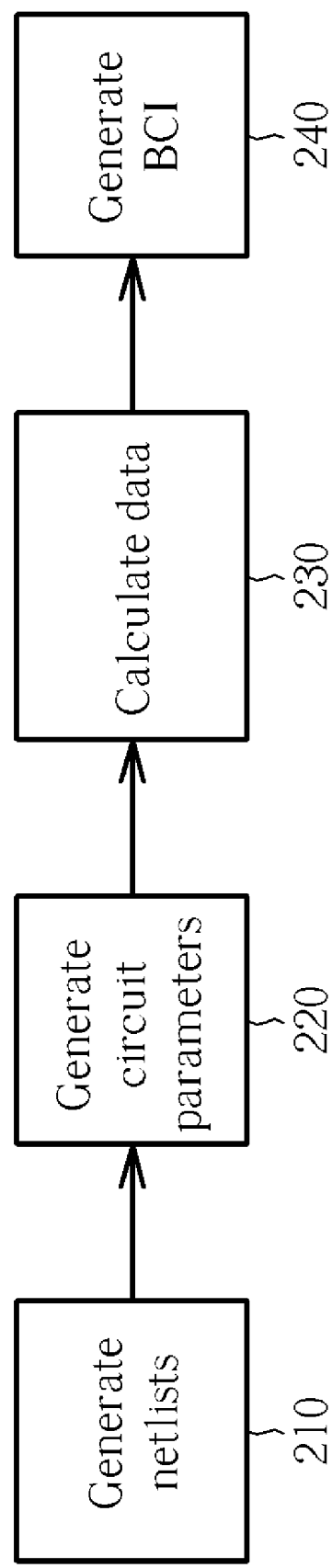
FIG. 4 is a flowchart of generating a best cell index according to the present invention.

Please refer to FIG. 4. FIG. 4 is a flowchart of generating a best cell index according to the present invention. According to the embodiment of the present invention, the flows of generating the best cell index (BCI) for each standard cell are as follows.

Step 210: generating netlists; selecting a plurality of surroundings and utilizing a environment simulator to generate the plurality of netlists corresponding to the plurality of surroundings for a standard cell, each netlist recording the critical dimensions of the standard cell; basically, the more different surroundings there are, the more precisely the index approached to the real condition can be obtained, but the time cost is also increased; thus, the embodiment gives 60 surroundings for an example so as to generate 60 netlists of the condition 1 to the condition 60;

Step 220: generating circuit parameters; the circuit parameters including timing data and power data, taking timing data as an example, utilizing a SPICE (simulation program with integrated circuit emphasis) simulator to generate a plurality of timing data of the standard cell according to the plurality of netlists in the step 210; the plurality of timing data are delay timing of the standard cell in the plurality of surroundings; 60 timing data are generated according to the netlists of the condition 1 to the condition 60;

Step 230: calculating data; calculating the differences of the plurality of circuit parameters in the step 220 and an ideal circuit parameter of the standard cell in an ideal condition, so from the 60 timing data the ideal timing data are subtracted respectively so as to obtain 60 timing differences;

Step 240: generating BCI; according to the property of the DELTA function, 60 timing difference in the step 230 are drawn as a chart, where the x-coordinate is a range of the plurality of timing differences and the y-coordinate is number of timing differences in a range; the formula of the best cell index of the standard cell is (Y/N)/X, where Y, N, and X are number of timing differences in a range with greatest number of timing differences, total number of the plurality of timing differences, and a range of the plurality of timing differences respectively.

The different circuit parameters are generated according to the critical dimensions of the standard cell, so the BCI corresponding to different circuit parameters can be generated according to the step 210 to step 240. The BCI for power parameters and timing parameters are BCI1, and BCI2 respectively as following:

$BCI1=(Y1/N1)/X1$, where Y1, N1, and X1 are number of differences of power data in a range with greatest number of differences of power data, total number of the plurality of differences of power data, and a range of the plurality of differences of power data respectively.

$BCI2=(Y2/N2)/X2$, Y2, N2, and X2 are number of differences of timing data in a range with greatest number of differences of timing data, total number of the plurality of differences of timing data, and a range of the plurality of differences of timing data respectively.

Figure 5:
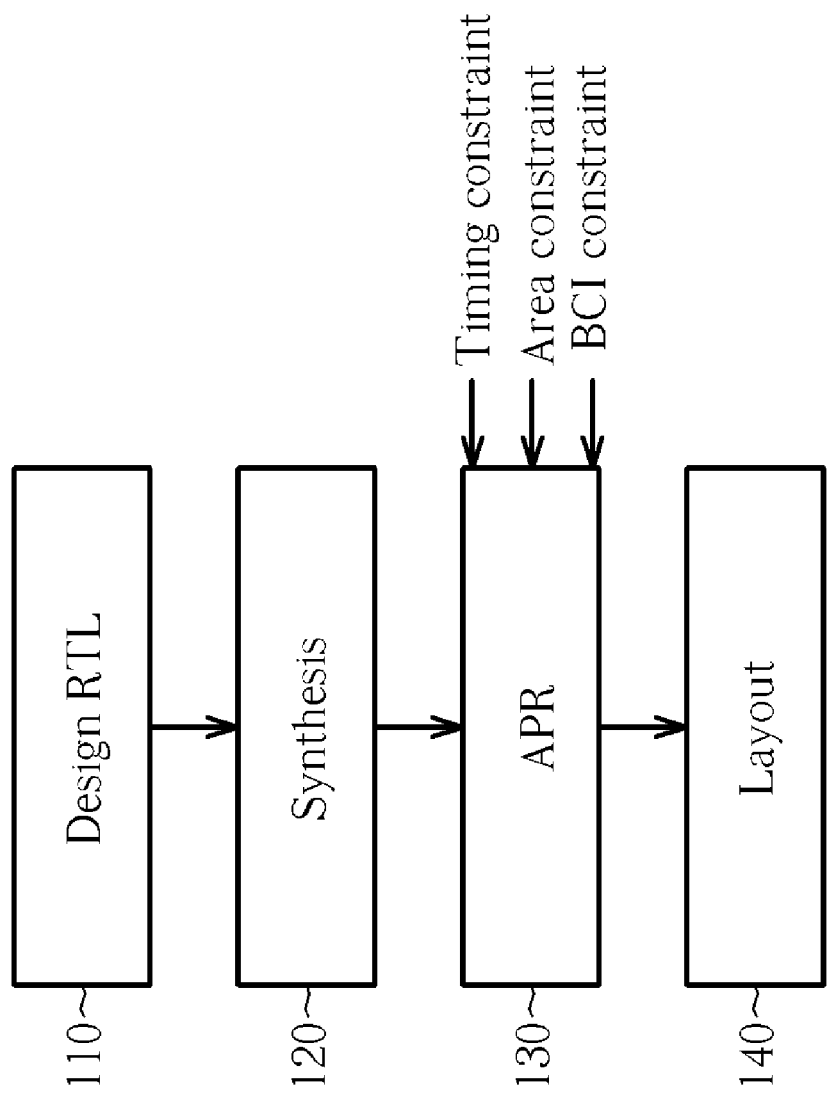
FIG. 5 is a flowchart of the IC design flow according to the present invention.

Please refer to FIG. 5. FIG. 5 is a flowchart of the IC design flow according to the present invention. The IC design flow comprises design RTL (register transfer level) 110, synthesis 120, APR (auto place and route) 130, and layout 140. In the step 110, the IC designer programs RTL code to describe a logic function requirement of a circuit. In the step 120, the RTL code generated in the step 110 is verified by synthesis software. In the step 130, an EDA (electronics design automation) tool places standard cells and routes wires for the RTL code that passed the verification, and the IC designer can choose the standard cells according to the specification of the circuit by himself. In the step 140, a layout of the circuit is generated. According to the embodiment of the present invention, each standard cell has information of the timing, area, and BCI. The BCI of the present invention is generated according to the critical dimensions of each standard cell, and the BCI can indicate the resistance to the environment. The larger the BCI is of the standard cell, the less the environment can influence the standard cell, which means the standard cell has a stable performance. According to the timing, area, and BCI of each standard cell, if the circuit requires a stable performance, the IC designer can choose a standard cell with a larger BCI, and if the layout size is limited, the IC designer can choose a standard cell with a small area. In addition, the IC designer sets weight and priority of the timing, area, and index according to the requirement of the cost or performance so that the EDA tool can choose a suitable standard cell. For example, if a layout requires a stable performance, the IC designer can set the priority as 2, 3, 1, and the weight as 30%, 20%, 50% for the timing, area, and index respectively; if a layout requires a low cost, the IC designer can set the priority as 3, 1, 2, and the weight as 20%, 50%, 30% for the timing, area, and index respectively.

Figure 6:
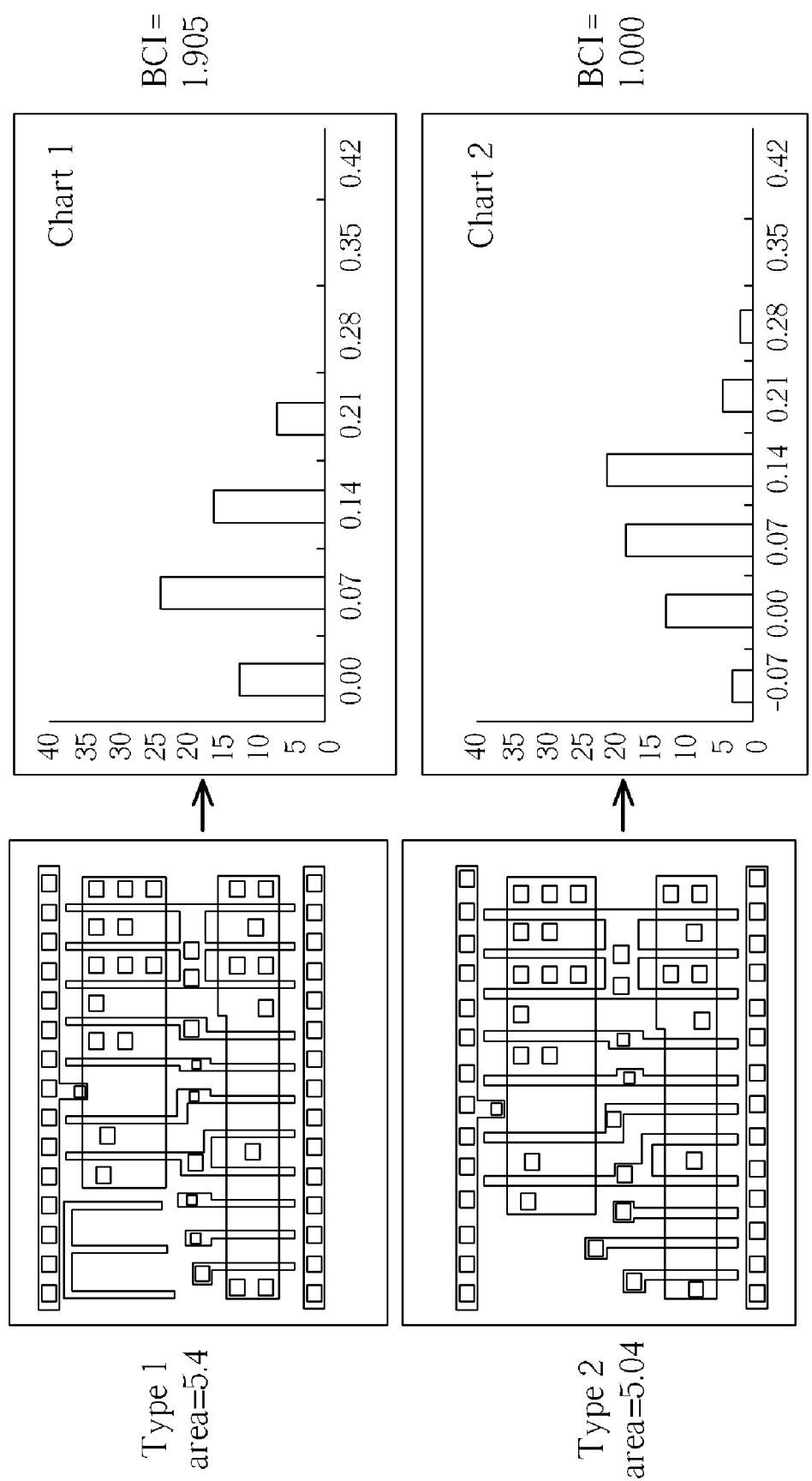
FIG. 6 is a diagram of the standard cells with the same function generating the BCI according to the present invention.

Please refer to FIG. 6. FIG. 6 is a diagram of the standard cells with the same function generating the BCI according to the present invention. In this embodiment, the standard cell AN4M6N has two different layout types, type 1 and type 2. The area of the type 1 is 5.4, and the area of the type 2 is 5.04. According to the step 210 to the step 240 in the FIG. 4, the environment simulator generates 60 conditions for the type 1 and type. Then the SPICE generates 60 timing differences for the type 1 and type 2 respectively. Finally, the 60 timing differences of the type 1 are drawn as the chart 1, and the 60 timing differences of the type 2 are drawn as the chart 2. The x-coordinate of the chart is a range of the plurality of timing differences with an interval of 0.07. The y-coordinate is number of timing differences in a range. The BCI of the type 1 and type 2 are as follows according to the BCI formula (Y/N)/X.

BCI of type 1=(24/60)/0.21=1.905

BCI of type 2=(21/60)/0.35=1.000

As the result of the BCI of the type 1 and type 2, the BCI of the type 1 is larger than the type 2, which means the layout of the type 1 has a more stable performance. In addition, comparing the chart 1 and chart 2, the distribution of the timing difference in the chart 1 is more centralized approached to the DELTA function. Thus, for the two types of the standard cell AN4M6N, the type 1 has a larger area, a high resistance to the environment, and a stable performance, and the type 2 has a small area and a low resistance to the environment.

Figure 7:
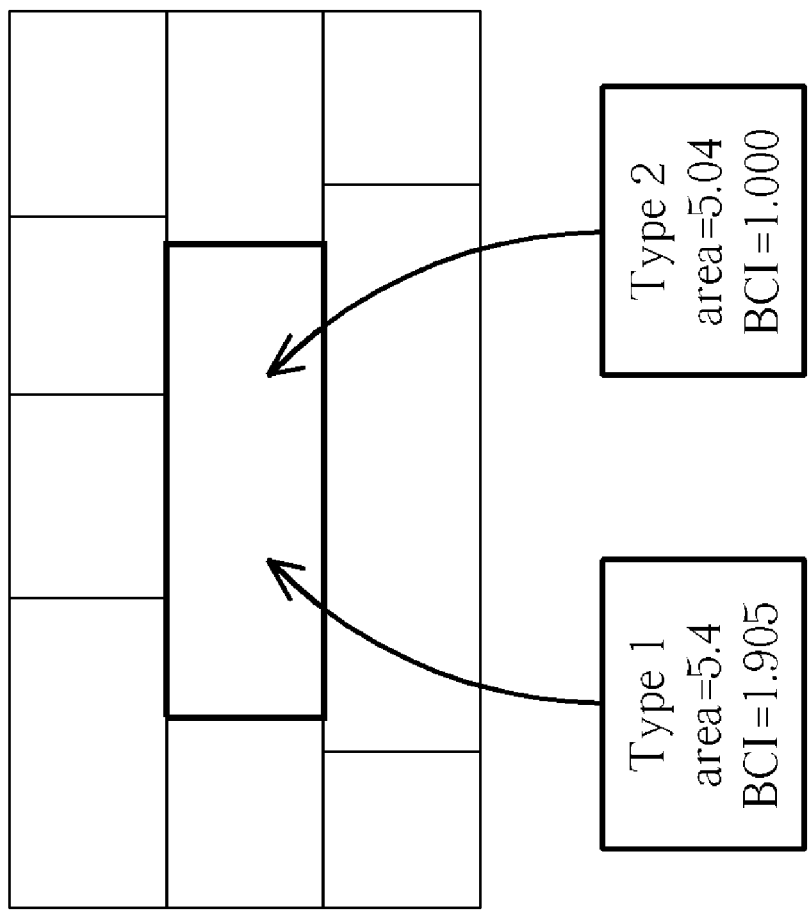
FIG. 7 is a diagram of selection of a standard cell for a layout according the present invention.

Please refer to FIG. 7. FIG. 7 is a diagram of selection of a standard cell for a layout according the present invention. For the IC designer, the BCI provides a reference index of the performance of the standard cell. When the circuit requires a stable performance, the IC designer can choose a standard cell with a larger BCI. On the other hand, when the layout size is limited but the performance is not requested strictly, the BCI is not an important reference and the area is considered first. As the example of the standard cell AN4M6N in the FIG. 6, when using the standard cell AN4M6N in the layout in the FIG. 7, the IC designer can choose the type 1 or type 2 for the standard cell AN4M6N. The type 1 has a larger area but a higher resistance to the environment, so the type 1 is a possible choice for an IC with a high performance and a high price. The type 2 has a smaller area but a lower resistance to the environment, so the type 2 is a possible choice for an IC with a limited layout size and a low cost. With the information of the timing, area, and BCI of the standard cell, the IC designer can more easily to choose a standard cell for the layout when designing the circuit.

In conclusion, the IC design flow comprises design RTL, synthesis, APR, and layout. In the embodiment of the present invention, the IC designer can choose a suitable standard cell for the layout according to the timing, area, and best cell index (BCI) of each standard cell. The BCI of each standard cell generated by utilizing the environment simulator to generate critical dimensions of the standard cell in a plurality of surroundings, utilizing a SPICE simulator to generate a plurality of circuit parameters corresponding to the plurality of surroundings, calculating the differences of the plurality of circuit parameters and the ideal circuit parameters of the standard cell, and analyzing the distribution of the differences. The BCI of the present invention is generated according to the critical dimensions of the standard cell in the different surroundings, and the BCI can indicate the resistance to the environment of each standard cell. The larger the BCI of the standard cell is, the less the environment can influence the standard cell, which means the standard cell has a stable performance. For the IC designer, the BCI provides a reference index of the performance of the standard cell. When the circuit requires a stable performance, the IC designer can choose a standard cell with a larger BCI. On the other hand, when the layout size is limited but the performance is not requested strictly, the BCI is not an important reference and the area is considered first. In addition, the IC designer sets the weight and priority of the timing, area, and index according to the requirement of the cost or performance so that the EDA tool can choose a suitable standard cell. Thus, the BCI is important information for the IC designer when designing the circuit.

Those skilled in the art will readily observe that numerous modifications and alterations of the device and method may be made while retaining the teachings of the invention.

What is claimed is:

1. A method of using Electronics Design Automation tools for determining a standard cell for an integrated circuit comprising:

providing a plurality of standard cells with a same function;

utilizing an environmental simulator to generate a plurality of circuit parameters corresponding to each of the standard cells in each of a plurality of different surrounding cell environments;

subtracting ideal timing data from each corresponding circuit parameter of each standard cell to generate a plurality of differences of circuit parameters;

utilizing the Electronics Design Automation tools to transform a distribution of the plurality of differences of circuit parameters of each standard cell into a respective cell index for each standard cell according to (Y/N)/X, where Y, N, and X are greatest number of differences of circuit parameters, total number of the plurality of differences of circuit parameters, and range of the plurality of differences of circuit parameters respectively; and choosing one standard cell from the plurality of standard cells with the same function for the integrated circuit according to the cell index of each standard cell.

2. The method of claim 1, wherein providing the plurality of standard cells with the same function is providing the plurality of standard cells with the same function but with a different layout size.

3. The method of claim 1, wherein transforming a distribution of the plurality of differences of circuit parameters of each standard cell into the respective cell index for each standard cell according to (Y/N)/X is calculating a centralization of the plurality of differences of circuit parameters of each standard cell to generate the cell index of each standard cell.

4. The method of claim 1, wherein choosing one standard cell from the plurality of standard cells with the same function for the integrated circuit according to the cell index of each standard cell is choosing one standard cell from the plurality of standard cells with the same function for the integrated circuit according to a weight or priority value of the cell index of each standard cell.

5. The method of claim 1, wherein utilizing the environmental simulator to generate the plurality of circuit parameters corresponding to each of the standard cells in each of a plurality of different surrounding cell environments is generating a plurality of timing data corresponding to the plurality of surrounding cell environments according to the circuit parameters of each standard cell in the plurality of surrounding cell environments.

6. The method of claim 1, wherein utilizing the environmental simulator to generate the plurality of circuit parameters corresponding to each of the standard cells in each of a plurality of different surrounding cell environments is generating a plurality of power data corresponding to the plurality of surrounding cell environments according to the circuit parameters of each standard cell in the plurality of surrounding cell environments.

7. The method of claim 1, wherein choosing one standard cell from the plurality of standard cells with the same function for the integrated circuit according to cell indices of the plurality of standard cells is to choose a standard cell with a larger cell index when stable performance is required of the integrated circuit, and to choose a standard cell with a smaller cell index when a smaller area is required of the integrated circuit.

8. A method of using Electronics Design Automation tools for determining a standard cell for an integrated circuit comprising:
   providing a plurality of standard cells with a same function;
   generating a first index of each standard cell according to a layout size of each standard cell;
   generating a second index of each standard cell according to timing data of each standard cell;
   utilizing an environment simulator to generate a plurality of circuit parameters corresponding to each of the standard cells in each of a plurality of different surrounding cell environments;
   subtracting ideal timing data from each corresponding circuit parameter of each standard cell to generate a plurality of differences of circuit parameters;
   generating a third index of each standard cell by utilizing the Electronics Design Automation tools to transform a distribution of the plurality of differences of circuit parameters of each standard cell into a respective cell index for each standard cell according to (Y/N)/X, where Y, N, and X are greatest number of differences of circuit parameters, total number of the plurality of differences of circuit parameters, and range of the plurality of differences of circuit parameters respectively;
   assigning weight and priority values for each of the first, second and third indexes respectively according to requirements of the integrated circuit; and
   choosing one standard cell from the plurality of standard cells with the same function for the integrated circuit according to the weight or priority values of the first, second and third indexes of each standard cell.

9. The method of claim 8, wherein providing the plurality of standard cells with the same function is providing the plurality of standard cells with the same function but with a different layout size.

10. The method of claim 8 wherein generating the third index by transforming the distribution of the plurality of differences of circuit parameters of each standard cell into the respective cell index for each standard cell according to (Y/N)/X is transforming the distribution of the plurality of differences of power data of each standard cell into a respective cell index for each standard cell according to (Y1/N1)/X1, wherein Y1, N1, and X1 are number of differences of power data in a range with greatest number of differences of power data, total number of the plurality of differences of power data, and a range of the plurality of differences of power data respectively.

11. The method of claim 8, wherein generating the third index by transforming the distribution of the plurality of differences of circuit parameters of each standard cell into a respective cell index for each standard cell according to (Y/N)/X is transforming the distribution of the plurality of differences of timing data of each standard cell into a respective cell index for each standard cell according to (Y2/N2)/X2, wherein Y2, N2, and X2 are number of differences of timing data in a range with greatest number of differences of timing data, total number of the plurality of differences of timing data, and a range of the plurality of differences of timing data respectively.

12. The method of claim 8, wherein assigning the weight and priority values of the first, second and third indexes respectively is assigning the weight and priority values of the first, second and third indexes respectively according to specification of the integrated circuit.

13. The method of claim 8, wherein choosing one standard cell from the plurality of standard cells with the same function for the integrated circuit according to the weight or priority values of the first, second and third indexes of each standard cell is utilizing the electronics design automation (EDA) tool to choose one standard cell from the plurality of standard cells with the same function for the integrated circuit according to weighted and/or prioritized first, second and third indexes of each standard cell.

* * * * *